United States Patent
Edelstein et al.

(10) Patent No.: US 10,283,583 B2
(45) Date of Patent: May 7, 2019

(54) 3D RESISTOR STRUCTURE WITH CONTROLLED RESISTIVITY

(71) Applicant: International Business Machines Corporation, Armonk, NY (US)

(72) Inventors: Daniel C. Edelstein, White Plains, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/403,908

(22) Filed: Jan. 11, 2017

(65) Prior Publication Data

US 2018/0197936 A1     Jul. 12, 2018

(51) Int. Cl.
| | |
|---|---|
| H01L 27/08 | (2006.01) |
| H01L 23/535 | (2006.01) |
| H01L 49/02 | (2006.01) |
| H01L 21/8252 | (2006.01) |
| H01L 21/768 | (2006.01) |

(52) U.S. Cl.
CPC ........ H01L 28/24 (2013.01); H01L 21/76895 (2013.01); H01L 21/8252 (2013.01); H01L 23/535 (2013.01); H01L 27/0802 (2013.01)

(58) Field of Classification Search
CPC ... H01L 21/76895; H01L 28/22; H01L 28/20; H01L 28/24; H01C 7/006; H01C 7/22; H01C 3/10; H01C 3/12; H01C 3/08; H01C 7/06
See application file for complete search history.

(56) References Cited

U.S. PATENT DOCUMENTS

| | | | |
|---|---|---|---|
| 5,410,913 A | * | 5/1995 | Blackburn .............. G01F 23/48 200/84 C |
| 5,485,138 A | | 1/1996 | Morris |
| 6,083,785 A | | 7/2000 | Segawa et al. |
| 6,207,560 B1 | | 3/2001 | Lee |

(Continued)

OTHER PUBLICATIONS

S.-M. Na, et al., "Electrical and structural properties of Ta—N thin film and Ta/Ta—N multilayer for embedded resistor", Thin Solid Films, Available online Jul. 13, 2007, pp. 5465-5469, 516.

(Continued)

*Primary Examiner* — Allen L Parker
*Assistant Examiner* — Gustavo G Ramallo
(74) *Attorney, Agent, or Firm* — Scully, Scott, Murphy & Presser, P.C.; Steven J. Meyers

(57) ABSTRACT

The present application provides a 3D resistor structure that is embedded within an interconnect dielectric material in which the resistivity of an electrical conducting resistive material of the 3D resistor structure can be tuned to a desired resistivity during the manufacturing of the 3D resistor structure. Notably, a patterned doped metallic insulator is formed straddling over an dielectric pillar. A controlled surface treatment process is then performed to an upper portion of the patterned doped metallic insulator to convert the upper portion of the patterned doped metallic insulator into an electrical conducting resistive material. An interconnect dielectric material can then be formed to embed the entirety of the remaining patterned doped metallic insulator and the electrical conducting resistive material.

19 Claims, 3 Drawing Sheets

(56) References Cited

U.S. PATENT DOCUMENTS

| | | | |
|---|---|---|---|
| 6,232,042 B1* | 5/2001 | Dunn | G03F 7/00 |
| | | | 427/126.6 |
| 6,433,429 B1 | 8/2002 | Stamper | |
| 6,437,440 B1 | 8/2002 | Cabral, Jr. et al. | |
| 6,440,807 B1 | 8/2002 | Ajmera et al. | |
| 6,534,360 B2 | 3/2003 | Narwankar et al. | |
| 6,665,033 B2 | 12/2003 | Callegari et al. | |
| 6,951,804 B2 | 10/2005 | Seutter et al. | |
| 7,057,490 B2 | 6/2006 | Hashimoto et al. | |
| 7,314,786 B1 | 1/2008 | Yang et al. | |
| 7,345,503 B2 | 3/2008 | Chen et al. | |
| 7,928,006 B2 | 4/2011 | Besling | |
| 8,013,394 B2 | 9/2011 | Chinthakindi et al. | |
| 8,962,473 B2 | 2/2015 | Kuo et al. | |
| 2002/0146915 A1* | 10/2002 | Narwankar | H01L 21/31604 |
| | | | 438/785 |
| 2004/0027234 A1 | 2/2004 | Hashimoto et al. | |
| 2006/0081962 A1 | 4/2006 | Wei et al. | |
| 2006/0148253 A1 | 7/2006 | Chung et al. | |
| 2007/0046421 A1 | 3/2007 | Gogineni | |
| 2008/0237800 A1 | 10/2008 | Chinthakindi et al. | |
| 2008/0251921 A1 | 10/2008 | Besling | |
| 2013/0234284 A1 | 9/2013 | Bonilla et al. | |
| 2014/0008764 A1 | 1/2014 | Yang et al. | |
| 2014/0264867 A1 | 9/2014 | Kuo et al. | |
| 2015/0333057 A1* | 11/2015 | Hoentschel | H01L 21/02164 |
| | | | 257/379 |
| 2016/0020148 A1* | 1/2016 | Song | H01L 23/535 |
| | | | 438/238 |
| 2017/0154950 A1* | 6/2017 | Basker | H01L 28/24 |

OTHER PUBLICATIONS

A. Scandurra, et al., "Tantalum nitride thin film resistors by low temperature reactive sputtering for plastic electronics", Surf. Interface Anal., Published online in Wiley Interscience: Feb. 20, 2008, pp. 758-762m, 40.

List of IBM Patents or Patent Applications Treated as Related dated Jan. 11, 2017, 2 pages.

Office Action dated Aug. 25, 2017 received in U.S. Appl. No. 15/403,946, Copy Not Enclosed.

Office Action dated Apr. 4, 2018 received in U.S. Appl. No. 15/799,435.

Office Action dated Apr. 12, 2018 received in U.S. Appl. No. 15/814,029.

Office Action dated Apr. 12, 2018 received in U.S. Appl. No. 15/799,378.

Office Action dated Apr. 19, 2018 received in U.S. Appl. No. 15/814,057.

Office Action dated Aug. 30, 2017 received in U.S. Appl. No. 15/403,971, Copy Not Enclosed.

Office Action dated Oct. 16, 2018 received in U.S. Appl. No. 15/814,057.

* cited by examiner

3D RESISTOR STRUCTURE WITH CONTROLLED RESISTIVITY

BACKGROUND

The present application relates to a semiconductor structure and a method of forming the same. More particularly, the present application relates to a semiconductor structure that includes a three-dimensional (3D) resistor structure that has vertical elements and controlled resistivity. The present application also provides a method of forming such a semiconductor structure.

A resistor, which is a passive two-terminal electrical component that implements electrical resistance as a circuit element, is one of the most common electrical components present in almost every electrical device. In electronic circuits, resistors can be used to limit current flow, to adjust signal levels, bias active elements, and terminate transition lines.

In semiconductor devices, it is well known to have a thin film resistor such as, for example, a resistor composed of TaN, embedded in the chip through either a damascene approach or a subtractive etch method. For example, and during back-end-of-the-line (BEOL) processing, a thin film resistor may be embedded in an interconnect dielectric material. Prior art methods of forming thin film resistors embedded in an interconnect dielectric material are complicated and expensive. Moreover, topography issues arise when embedding a thin film resistor in an interconnect dielectric material which may degrade the final chip yield. Other issues with prior art methods of embedding a thin film metal resistor in a MOL dielectric material include variation of sheet resistivity and tuning precision.

There is thus a need for providing a semiconductor structure including a resistor structure that is embedded in an interconnect dielectric material that has design flexibility and controlled resistivity.

SUMMARY

The present application provides a 3D resistor structure that is embedded within an interconnect dielectric material in which the resistivity of an electrical conducting resistive material of the 3D resistor structure can be tuned to a desired resistivity during the manufacturing of the 3D resistor structure. Notably, a patterned doped metallic insulator is formed straddling over a dielectric pillar. A controlled surface treatment process is then performed to an upper portion of the patterned doped metallic insulator to convert the upper portion of the patterned doped metallic insulator into an electrical conducting resistive material. An interconnect dielectric material can then be formed to embed the entirety of the remaining patterned doped metallic insulator and the electrical conducting resistive material.

In one aspect of the present application, a semiconductor structure is provided. In one embodiment of the present application, the semiconductor structure may include a dielectric pillar located on a surface of a substrate. A three-dimensional (3D) resistor structure straddles over the dielectric pillar. The 3D resistor structure includes an electrical conducting resistive material located on a doped metallic insulator. An interconnect dielectric material entirely embeds the 3D resistor structure.

In another aspect of the present application, a method of forming a semiconductor structure is provided. In one embodiment of the present application, the method may include forming a dielectric pillar on a surface of a substrate. A patterned doped metallic insulator is then formed straddling over the dielectric pillar. Next, a controlled surface treatment process is performed to an upper portion of the patterned doped metallic insulator to convert the upper portion of the patterned doped metallic insulator into an electrical conducting resistive material. A remaining portion of the patterned doped metallic insulator and the electrical conductive resistive material provide a three-dimensional (3D) resistor structure. An interconnect dielectric material is formed on the substrate and embedding the 3D resistor structure.

DETAILED DESCRIPTION

Figure 1:
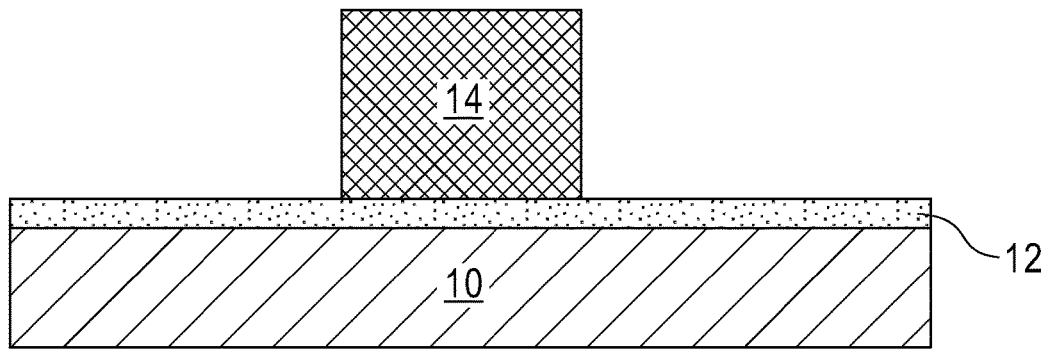
FIG. 1 is a cross sectional view of an exemplary semiconductor structure that includes a dielectric pillar located on a surface of a substrate in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring now to FIG. 1, there is illustrated the exemplary semiconductor structure that can be employed in accordance with an embodiment of the present application. The exemplary semiconductor structure of FIG. 1 includes a dielectric pillar 14 located on a surface of a substrate. The dielectric pillar 14, which extends upward from the substrate, provides a topography to the exemplary semiconductor structure shown in FIG. 1. Dielectric pillar 14 has a pair of sidewall surfaces that extend along a length-wise dielectric and another pair of sidewalls that extend along a width-wise direction.

In some embodiments (and as shown), the substrate includes a base substrate 10 and a dielectric layer 12. In other embodiments (not shown), the dielectric layer 12 may be omitted and only the base substrate 10 is employed as the substrate.

The base substrate 10 may be composed of a semiconductor material, an insulator material, a conductive material or any combination thereof. When the base substrate 10 is composed of a semiconductor material, any material having semiconducting properties such as, for example, Si, SiGe, SiGeC, SiC, Ge alloys, III/V compound semiconductors or II/VI compound semiconductors, may be used. In addition to these listed types of semiconductor materials, base substrate 10 can be a layered semiconductor such as, for example, Si/SiGe, Si/SiC, silicon-on-insulators (SOIs) or silicon germanium-on-insulators (SGOIs).

When the base substrate 10 is an insulator material, the insulator material can be an organic insulator, an inorganic insulator or any combination thereof including multilayers. When base substrate 10 is a conductive material, base substrate 10 may include, for example, polySi, an elemental metal, alloys of elemental metals, a metal silicide, a metal nitride or any combination thereof including multilayers. When base substrate 10 is composed of a semiconductor material, one or more semiconductor devices such as, for example, complementary metal oxide semiconductor (CMOS) devices can be fabricated thereon. When base substrate 10 is composed of a combination of an insulator material and a conductive material, base substrate 10 may represent an underlying interconnect level of a multilayered interconnect structure.

Dielectric layer 12 may be composed of any dielectric material including for example, silicon carbide (SiC), silicon nitride ($Si_3N_4$), silicon dioxide ($SiO_2$), a carbon doped oxide, a nitrogen and hydrogen doped silicon carbide (SiC (N,H)) or a multilayered stack of at least one of the aforementioned dielectric materials. In embodiments in which base substrate 10 is an insulator material, the dielectric layer 12 and the insulator material that provides base substrate 10 are typically composed of different materials. The dielectric material that provides the dielectric layer 12 may be formed utilizing a deposition process such as, for example, chemical vapor deposition (CVD), plasma enhanced chemical vapor deposition (PECVD), atomic layer deposition (ALD), chemical solution deposition or evaporation.

The dielectric layer 12 may have a thickness from 10 nm to 100 nm. Other thicknesses that are lesser than 10 nm, or greater than 100 nm may also be used as the thickness of the dielectric layer 12.

Dielectric pillar 14 may be composed of one of the dielectric materials mentioned above for the dielectric layer 12. When dielectric layer 12 is present, the dielectric material that provides the dielectric pillar 14 is composed of a different dielectric material than the dielectric material that provides dielectric layer 12. Although the present application describes and illustrates a single dielectric pillar, a plurality of dielectric pillars can be formed on the surface of the substrate (10, 12). When a plurality of dielectric pillars is present, each dielectric pillar is spaced apart from each other.

At this point of the present application, dielectric pillar 14 has physically exposed sidewall surfaces and a physical exposed topmost surface; the bottommost surface of the dielectric pillar 14 is present on the substrate (10/12). Dielectric pillar 14 may have a height from 5 nm to 2000 nm, and a width from 50 nm to 500 nm.

The dielectric pillar 14 can be formed by first depositing a continuous layer of a dielectric material on the substrate (10/12). The deposition of the dielectric material that provides the dielectric pillar 14 may include one of the deposition processes mentioned above for forming the dielectric layer 12. After deposition of the dielectric material, the dielectric pillar 14 is formed by patterning the continuous layer of dielectric material.

In one embodiment, patterning may include lithography and etching. The lithographic process includes forming a photoresist (not shown) atop a material or material stack to be patterned, exposing the photoresist to a desired pattern of radiation and developing the exposed photoresist utilizing a conventional resist developer. The photoresist may be a positive-tone photoresist, a negative-tone photoresist or a hybrid-tone photoresist. The photoresist may be formed utilizing a deposition process such as, for example, spin-on coating. The etching process includes a dry etching process (such as, for example, reactive ion etching, ion beam etching, plasma etching or laser ablation), and/or a wet chemical etching process. Typically, reactive ion etching is used in providing the exemplary semiconductor structure shown in FIG. 1. In some embodiments, the etch stops on the dielectric layer 12. In other embodiments, and when dielectric layer 12 is not present, the etch stops on the base substrate 10.

Other patterning processes including, but not limited to, sidewall image transfer (SIT), or directional self-assembly (DSA) may also be used to pattern the continuous layer of dielectric material into the dielectric pillar 14.

Figure 2:
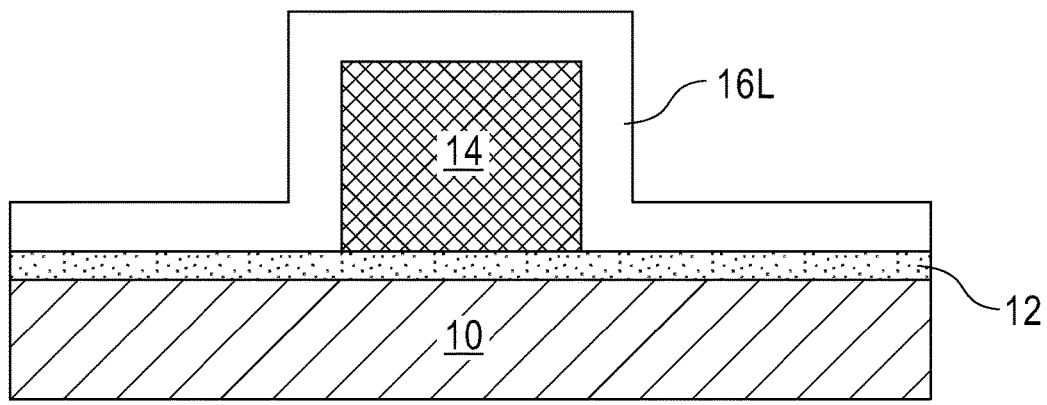
FIG. 2 is a cross sectional view of the exemplary semiconductor structure of FIG. 1 after forming a doped metallic insulator layer straddling over the dielectric pillar and located on physically exposed surfaces of the substrate.

Referring now to FIG. 2, there is illustrated the exemplary semiconductor structure of FIG. 1 after forming a doped metallic insulator layer 16L straddling over the dielectric pillar 14 and located on physically exposed surfaces of the substrate (10/12). By "straddling over" it is meant that a material such as, for example, the doped metallic insulator layer 16L, is present on sidewall surfaces and a topmost surface another material such as, for example, the dielectric pillar 14.

Doped metallic insulator layer 16L is a continuous (without any voids and/or breaks) layer. In one embodiment, doped metallic insulator layer 16L may include a nitrogen-doped metal that is composed of nitrogen, N, and a metal, M. In another embodiment, doped metallic insulator layer 16L may include an oxygen-doped metal that is composed of oxygen, O, and a metal, M. In yet another embodiment, doped metallic insulator layer 16L may include a nitrogen- and oxygen-doped metal that is composed of nitrogen, N, oxygen, O, and a metal M. In any of the above mentioned embodiments, metal, M, is a ohmic material such as, for example, titanium (Ti), tantalum (Ta), ruthenium (Ru), tungsten (W), platinum (Pt), cobalt (Co), rhodium (Rh) and manganese (Mn). In one example, the doped metallic insulator layer 16L is $Ta_3N_5$. In any of the above mentioned embodiments, the ratio of nitrogen and/or oxygen to metal in the doped metallic insulator layer 16L provides a crystal structure having an insulating phase, which upon performing a subsequent controlled surface treatment is converted into an electrical conducting phase.

Doped metallic insulator layer 16L may be formed utilizing a deposition process such as, for example, chemical vapor deposition (CVD), plasma enhanced chemical vapor deposition (PECVD), atomic layer deposition (ALD), physical vapor deposition (PVD), sputtering, chemical solution deposition or plating.

Doped metallic insulator layer 16L may have a thickness of from 5 nm to 50 nm. Other thicknesses that are lesser than 5 nm, or greater than 50 nm can also be employed as the thickness of the doped metallic insulator layer 16L.

Figure 3:
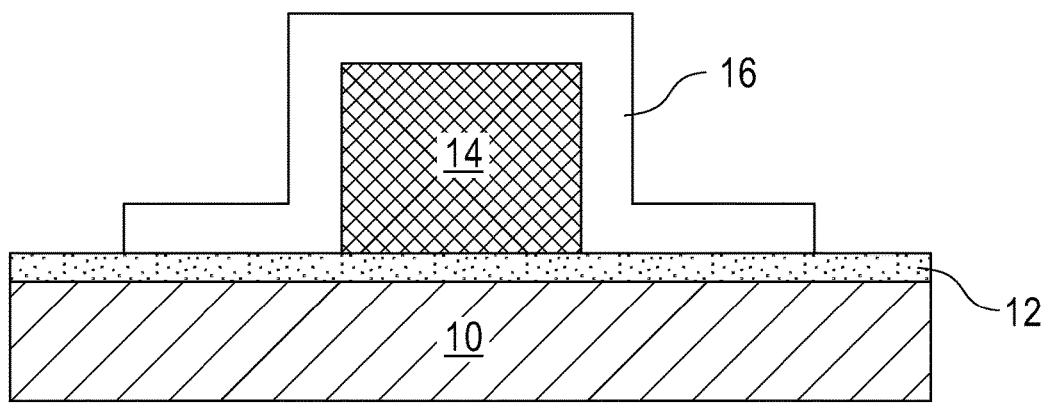
FIG. 3 is a cross sectional view of the exemplary semiconductor structure of FIG. 2 after patterning the doped metallic insulator layer to provide a patterned doped metallic insulator.

Referring now to FIG. 3, there is illustrated the exemplary semiconductor structure of FIG. 2 after patterning the doped metallic insulator layer 16L. The remaining portion of the doped metallic insulator layer 16L after patterning may be referred to as a patterned doped metallic insulator 16. As is shown, the patterned doped metallic insulator 16 straddles over the dielectric pillar 14. Patterning of the doped metallic insulator layer 16L may include lithography and etching as defined above.

Figure 4:
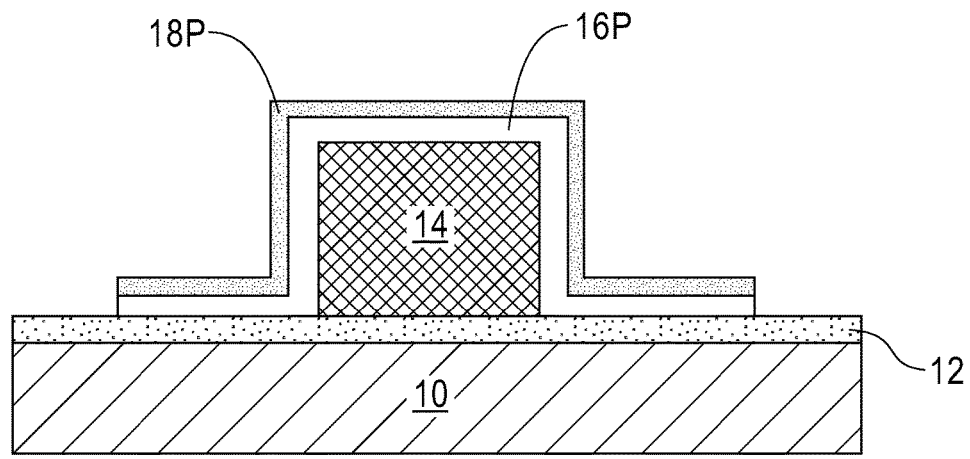
FIG. 4 is a cross sectional of the exemplary semiconductor structure of FIG. 3 after performing a controlled surface treatment in which an upper portion of the patterned doped metallic insulator is converted into an electrical conducting metallic nitride and/or oxide, wherein the remaining portion of the patterned doped metallic insulator and the electrical conducting metallic nitride and/or oxide provide a 3D resistor structure.

Referring now to FIG. 4, there is illustrated the exemplary semiconductor structure of FIG. 3 after performing a controlled surface treatment in which an upper portion of the patterned doped metallic insulator 16 is converted into an electrical conducting metallic nitride and/or oxide 18P and to provide a 3D resistor structure that includes the remaining portion of the patterned doped metallic insulator (hereinafter doped metallic insulator 16P) and the electrical conducting metallic nitride and/or oxide 18P. The 3D resistor structure (16P/18P) straddles over the dielectric pillar 14 and is present on physically exposed surface of the substrate (10/12). The 3D resistor structure (16P/18P) includes vertical elements located on sidewall surfaces of the dielectric pillar 14, and horizontal elements located on a topmost surface of each of the dielectric pillar 14 and substrate (10/12).

The term "metallic nitride and/or oxide" denotes a metallic nitride, a metallic oxide, or a metallic nitride-oxide. The electrical conducting metallic nitride and/or oxide 18P includes the same metal as the doped metallic insulator layer 16L. In one example, the electrical conducting metallic nitride and/or oxide 18P is TaN. The electrical conductive metallic nitride and/or oxide 18P may also be referred to herein as an electrical conducting resistive material.

The controlled surface treatment process may include introducing atoms of nitrogen ($N_2$), atoms of oxygen ($O_2$), atoms of hydrogen ($H_2$), atoms of argon (Ar) or any combination of the aforementioned atoms into the upper portion of the patterned doped metallic insulator 16 such that the insulating phase of the exposed portion of the patterned doped metallic insulator 16 is converted into a crystal structure having an electrical conducting phase. In one embodiment, after the controlled surface treatment process, the ratio of oxygen and/or nitrogen in the upper portion of the patterned doped metallic insulator 16 is changed such that the upper portion of the patterned doped metallic insulator 16 is converted from insulating to conducting. In one example, the patterned doped metallic insulator 16 is $Ta_3N_5$, and the resulting electrical conducting resistive material (i.e., the electrical conducting nitride and/or oxide 18P) is TaN.

The controlled surface treatment process changes the composition of the exposed upper portion of the patterned doped metallic insulator 16 into an electrical conducting metallic material. Tuning of the resistivity of the resultant electrical conducting metallic material, i.e., the electrical conducting metallic nitride and/or oxide 18P, can be achieved by adjusting the depth of the controlled surface treatment process. In one embodiment of the present application, the controlled surface treatment converts from 1 nm to 3 nm of the patterned doped metallic insulator 16 into the electrical conducting resistive material. Other depths are possible as long as at least a portion of the patterned doped metallic insulator 16 remains after the controlled surface treatment process. As stated above, the remaining portion of the patterned doped metallic insulator can be referred to as a doped metallic insulator 16P.

The controlled surface treatment may include, but is not limited to, a thermal process, a plasma process, a gas cluster ion beam process, an ion beam process or an ion implantation process.

The thermal process may include thermal treatments in an ambient containing at least one of nitrogen ($N_2$), oxygen ($O_2$), hydrogen ($H_2$), and argon (Ar). In one example, the thermal treatments may include a thermal nitridation, and/or a thermal oxidation. The thermal processes do not include an electrical bias higher than 200 W. The thermal processes may include a laser beam treatment. In some embodiments, no electrical bias is performed during the thermal processes.

In one example, and when a thermal nitridation process is employed, the thermal nitridation process can be performed in any nitrogen-containing ambient, which is not in the form of a plasma. The nitrogen-containing ambients that can be employed in the present application include, but are not limited to, $N_2$, $NH_3$, $NH_4$, NO, or $NH_x$ wherein x is between 0 and 1. Mixtures of the aforementioned nitrogen-containing ambients can also be employed in the present application. In some embodiments, the nitrogen-containing ambient is used neat, i.e., non-diluted. In other embodiments, the nitrogen-containing ambient can be diluted with an inert gas such as, for example, helium (He), neon (Ne), argon (Ar) and mixtures thereof. In some embodiments, hydrogen ($H_2$) can be used to dilute the nitrogen-containing ambient.

In another example, and when a thermal oxidation process is employed, the thermal oxidation process can be performed in any oxygen-containing ambient, which is not in the form of a plasma. In one example, ozone ($O_3$) is employed as the oxygen-containing ambient. Other oxygen containing ambients may also be employed. Mixtures of the aforementioned oxygen-containing ambients can also be employed in the present application. In some embodiments, the oxygen-containing ambient is used neat, i.e., non-diluted. In other embodiments, the oxygen-containing ambient can be diluted with an inert gas such as, for example, helium (He), neon (Ne), argon (Ar) and mixtures thereof. In some embodiments, hydrogen ($H_2$) can be used to dilute the oxygen-containing ambient.

When a combined thermal nitridation and oxidation process is employed, a combination of nitrogen-containing and oxygen containing ambients used neat or admixed with an inert gas or hydrogen can be employed.

In the specific examples mentioned above (i.e., thermal oxidation and/or thermal nitridation), the content of nitrogen ($N_2$) and/or oxygen ($O_2$) within the ambient employed in the present application is typically from 10% to 100%, with a nitrogen and/or oxygen content within the ambient from 50% to 80% being more typical. In one embodiment, the thermal processes employed in the present application is performed at a temperature from 50° C. to 600° C.

Hydrogen ($H_2$) or argon (Ar) thermal processes can be performed neat or diluted and the amounts of hydrogen ($H_2$) or argon (Ar) in such thermal processes can also be in the range from 10% to 100%.

When a plasma process is used, an electrical bias of greater than 200 W can be employed. The plasma process is performed by generating a plasma from one of the ambients (neat or diluted) that are mentioned above for the thermal process; notably a plasma containing at least one of nitrogen ($N_2$), oxygen ($O_2$), hydrogen ($H_2$), and argon (Ar) is provided and used during the controlled surface treatment process. In one embodiment, the plasma process employed in the present application is performed at a temperature from 50° C. to 600° C.

When an ion beam process is employed, a beam of at least one of nitrogen ($N_2$) ions, oxygen ($O_2$) ions, hydrogen ($H_2$) ions, and argon (Ar) ions generated from an ion source such as one of the aforementioned ambients is impinged upon the patterned doped metallic insulator 16. The ion beam process may be performed utilizing any ion beam apparatus. The energy of the ion beam process can from 10 eV to 100 eV. The ion beam process can be performed at a temperature from 50° C. to 600° C.

When a gas cluster ion beam process is employed, a cluster of at least one of nitrogen ($N_2$) ions, oxygen ($O_2$) ions, hydrogen ($H_2$) ions, and argon (Ar) ions generated from an ion source such as one of the aforementioned ambients is impinged upon the patterned doped metallic insulator 16. The gas cluster ion beam process may be performed utilizing any gas cluster ion beam apparatus. The energy of the gas cluster ion beam process can from 10 eV to 30 eV. The gas cluster ion beam process can be performed at a temperature from 50° C. to 600° C.

When ion implantation is employed, at least one of nitrogen ($N_2$) ions, oxygen ($O_2$) ions, hydrogen ($H_2$) ions, and argon (Ar) ions generated from an ion source such as one of the aforementioned ambients are impinged upon the patterned doped metallic insulator 16. The ion implantation process may be performed utilizing any ion implantation apparatus. The energy of the ion implantation process can from 10 eV to 200 eV. The ion implantation process can be performed at a temperature from 50° C. to 600° C.

Figure 5:
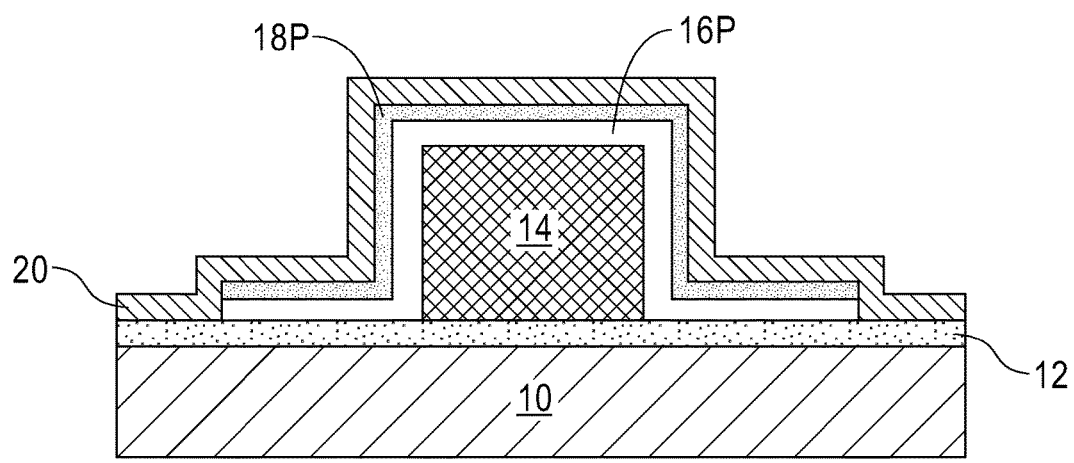
FIG. 5 is a cross sectional view of the exemplary semiconductor structure of FIG. 4 after forming a dielectric capping layer on physically exposed portions of the substrate and the 3D resistor structure.

Referring now to FIG. 5, there is illustrated the exemplary semiconductor structure of FIG. 4 after forming a dielectric capping layer 20 on physically exposed portions of the substrate (10/12) and the resistor structure (16P/18P). Notably, the dielectric capping layer 20 is formed directly on physically exposed portions of the topmost surface of substrate (10/12) as well as sidewall surfaces and a topmost surface of the resistor structure (16P/18P). In some embodiments, the formation of the dielectric capping layer 20 may be omitted.

When present, the dielectric capping layer 20 may include any dielectric capping material such as, for example, silicon carbide (Si), silicon nitride ($Si_3N_4$), silicon dioxide ($SiO_2$), a carbon doped oxide, a nitrogen and hydrogen doped silicon carbide (SiC(N,H)) or a multilayered stack of at least one of the aforementioned dielectric capping materials. The dielectric capping material that provides the dielectric capping layer 20 may be formed utilizing a deposition process such as, for example, chemical vapor deposition (CVD), plasma enhanced chemical vapor deposition (PECVD), atomic layer deposition (ALD), chemical solution deposition or evaporation.

When present, dielectric capping layer 20 may have a thickness from 10 nm to 100 nm. Other thicknesses that are lesser than 10 nm, or greater than 100 nm may also be used as the thickness of the dielectric capping layer 20.

Figure 6:
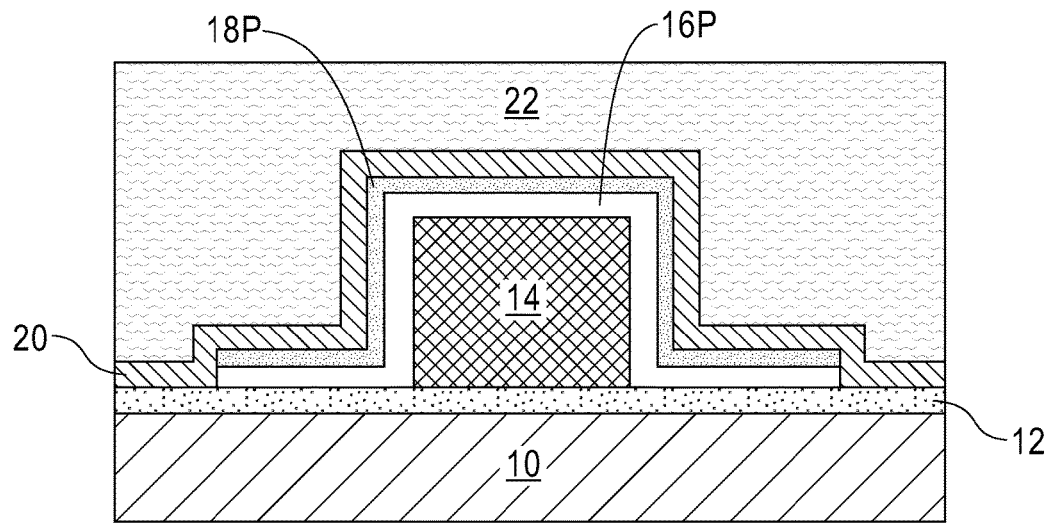
FIG. 6 is a cross sectional view of the exemplary semiconductor structure of FIG. 5 after forming an interconnect dielectric material on the dielectric capping layer.

Referring now to FIG. 6, there is illustrated the exemplary semiconductor structure of FIG. 5 after forming an interconnect dielectric material 22 on the dielectric capping layer 20.

The interconnect dielectric material 22 may be composed of an inorganic dielectric material or an organic dielectric material. In some embodiments, the interconnect dielectric material 22 may be porous. In other embodiments, the interconnect dielectric material 22 may be non-porous. Examples of suitable dielectric materials that may be employed as the interconnect dielectric material 22 include, but are limited to, silicon dioxide, undoped or doped silicate glass, silsesquioxanes, C doped oxides (i.e., organosilicates) that include atoms of Si, C, O and H, theremosetting polyarylene ethers or any multilayered combination thereof. The term "polyarylene" is used in this present application to denote aryl moieties or inertly substituted aryl moieties which are linked together by bonds, fused rings, or inert linking groups such as, for example, oxygen, sulfur, sulfone, sulfoxide, or carbonyl.

The interconnect dielectric material 22 may have a dielectric constant (all dielectric constants mentioned herein are measured relative to a vacuum, unless otherwise stated) that is about 4.0 or less. In one embodiment, the interconnect dielectric material 22 has a dielectric constant of 2.8 or less. These dielectrics generally having a lower parasitic cross talk as compared to dielectric materials whose dielectric constant is greater than 4.0.

The interconnect dielectric material 22 may be formed by a deposition process such as, for example, chemical vapor deposition (CVD), plasma enhanced chemical vapor deposition (PECVD) or spin-on coating. The interconnect dielectric material 22 may have a thickness from 50 nm to 250 nm. Other thicknesses that are lesser than 50 nm, and greater than 250 nm can also be employed as long as the interconnect dielectric material 22 entirely embeds the resistor structure (16P/18P) provided above. That is, the interconnect dielectric material 22 must cover the entire resistor structure (16P/18P).

Figure 7:
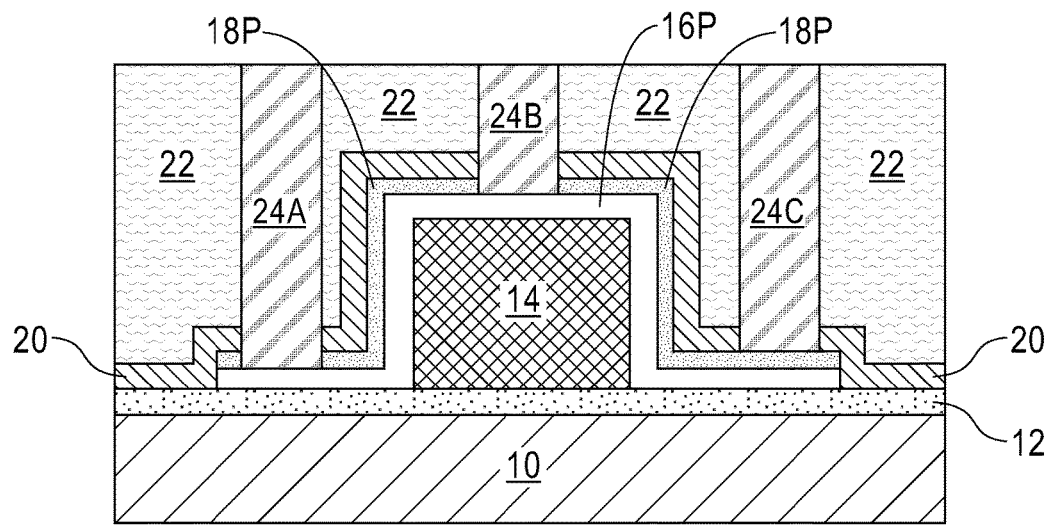
FIG. 7 is a cross sectional view of the exemplary semiconductor structure of FIG. 6 after forming a first contact structure that contacts a first portion of the remaining portion of the patterned doped metallic insulator, a second contact structure contacting a second portion of the remaining portion of the patterned doped metallic insulator, and a third contact structure contacting a portion of the electrical conducting metallic nitride and/or oxide.

Referring now to FIG. 7, there is illustrated the exemplary semiconductor structure of FIG. 6 after forming a first contact structure 24A that contacts a first portion of the remaining portion of the patterned doped metallic insulator (i.e., the doped metallic insulator 16P), a second contact structure 24B contacting a second portion of the remaining portion of the patterned doped metallic insulator (i.e., the doped metallic insulator 16P), and a third contact structure 24C contacting a portion of the electrical conducting metallic nitride and/or oxide (i.e., the electrical conducting resistive material) 18P.

The first contact structure 24A, the second contact structure 24B and the third contact structure 24C are spaced apart from each other. In the illustrated embodiment shown in FIG. 7, the first contact structure 24A is located on one side of the dielectric pillar 14, while the third contact structure 24C is located on another side of the dielectric pillar 14. The second contact structure 24B is located above the topmost surface of the dielectric pillar 14.

The 3D resistor structure shown in FIG. 7 is a vertical resistor that can function as three separate resistors. The first resistor can be provided by the first and second contact structures (24A/24B), the second resistor can be provided by the second and third contact structures (24B/24C), and the third resistor can be provided by the first and third contact structures (24A/24C).

Each contact structures (24A, 24B, 24C) can be formed by first providing contact openings into the interconnect dielectric material 22 and, if present, the dielectric capping layer 20. The first and second contact openings physically expose different portions of the topmost surface of doped metallic insulator 16P, while the third contact opening physically exposes a topmost surface of the electrical conducting metallic nitride and/or oxide (i.e., the electric conducting resistive material) 18P. Each contact opening may be formed by lithography and etching as defined above. After providing the contact openings, each contact opening is then filled, at least in part, with a contact metal or metal alloy. The contact metal or metal alloy that provides at least a portion of the contact structures (24A, 24B, 24C) may include tungsten (W), cobalt (Co), aluminum (Al), copper (Cu), or a copper-aluminum alloy (in such an alloy copper may compose a majority (i.e., greater than 50 atomic percent) of the alloy, aluminum may compose a majority (i.e., greater than 50 atomic percent) of the alloy, or copper and aluminum are present in equal amounts (i.e., both elements are present at 50 atomic percent)).

The contact metal or metal alloy that provides at least a portion of the contact structures (24A, 24B, 24C) can be formed by a deposition process such as, for example, chemical vapor deposition (CVD), plasma enhanced chemical vapor deposition (PECVD), sputtering or plating. In some embodiments, a planarization process may follow the deposition of the contact metal or metal alloy. In the illustrated embodiment, the contact structures (24A, 24B, 24C) have a topmost surface that is coplanar with each as well as being coplanar with a topmost surface of the interconnect dielectric material 22.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
 a dielectric pillar located on a surface of a substrate;
 a three-dimensional (3D) resistor structure straddling over the dielectric pillar, the 3D resistor structure including an electrical conducting resistive material located on a doped metallic insulator;
 an interconnect dielectric material entirely embedding the 3D resistor structure; and
 a first contact structure, a second contact structure and a third contact structure located in the interconnect dielectric material and contacting different portions of the 3D resistor structure.

2. The semiconductor structure of claim 1, further comprising a dielectric capping layer located between the 3D resistor structure and the interconnect dielectric material.

3. The semiconductor structure of claim 1, wherein the electrical conductive resistive material is selected from the group consisting of a metallic nitride, a metallic oxide, and a metallic nitride-oxide.

4. The semiconductor structure of claim 1, wherein the doped metallic insulator is selected from a nitrogen doped metal, an oxygen doped metal or a nitrogen and oxygen doped metal.

5. The semiconductor structure of claim 1, wherein the electrical conducting resistive material is composed of tantalum nitride (TaN) and the doped metallic insulator is composed of $Ta_3N_5$.

6. The semiconductor structure of claim 1, wherein the substrate comprises a dielectric layer and a base substrate.

7. The semiconductor structure of claim 1, wherein the first contact structure contacts a portion of the doped metallic insulator located on one side of the dielectric pillar, the second contact structure contacts another portion of the doped metallic insulator located above a topmost surface of the dielectric pillar and the third contact structure contacts a portion of the electrical conducting resistive material located on another side of the dielectric pillar.

8. The semiconductor structure of claim 1, wherein the first and second contact structures provide a first resistor, the second and third contact structures provide a second resistor, and the first and third contact structures provide a third resistor.

9. The semiconductor structure of claim 1, wherein each of the first, second and third contact structures has a topmost surface that is coplanar with each other as well as being coplanar with a topmost surface of the interconnect dielectric material.

10. A method of forming a semiconductor structure, the method comprising:
 providing a dielectric pillar on a surface of a substrate;
 forming a patterned doped metallic insulator straddling over the dielectric pillar;
 performing a controlled surface treatment process to an upper portion of the patterned doped metallic insulator to convert the upper portion of the patterned doped metallic insulator into an electrical conducting resistive material, wherein a remaining portion of the patterned doped metallic insulator and the electrical conductive resistive material provide a three-dimensional (3D) resistor structure; and
 forming an interconnect dielectric material on the substrate and embedding the 3D resistor structure.

11. The method of claim 10, wherein the controlled surface treatment process provides a phase change in the upper portion of the patterned doped metallic insulator.

12. The method of claim 11, wherein the controlled surface treatment process comprises a thermal process, a plasma process, a gas cluster ion beam process, an ion beam process or an ion implantation process.

13. The method of claim 10, wherein the electrical conductive resistive material is selected from the group consisting of a metallic nitride, a metallic oxide, and a metallic nitride-oxide.

14. The method of claim 10, wherein the patterned doped metallic insulator is selected from a nitrogen doped metal, an oxygen doped metal or a nitrogen and oxygen doped metal.

15. The method of claim 10, wherein the electrical conducting resistive material is composed of tantalum nitride (TaN) and the patterned doped metallic insulator is composed of $Ta_3N_5$.

16. The method of claim 10, further comprising forming a first contact structure, a second contact structure and a third contact structure in the interconnect dielectric material and contacting different portions of the 3D resistor structure.

17. The method of claim 16, wherein the first contact structure contacts a portion of the remaining portion of the patterned doped metallic insulator located on one side of the dielectric pillar, the second contact structure contacts another portion of the remaining portion of the patterned doped metallic insulator located above a topmost surface of the dielectric pillar and the third contact structure contacts a portion of the electrical conducting resistive material located on another side of the dielectric pillar.

18. The method of claim 16, wherein the first and second contact structures provide a first resistor, the second and third contact structures provide a second resistor, and the first and third contact structures provide a third resistor.

19. The method of claim 16, wherein each of the first, second and third contact structures has a topmost surface that is coplanar with each other as well as being coplanar with a topmost surface of the interconnect dielectric material.

\* \* \* \* \*